United States Patent [19]

Shiga

[11] Patent Number: 5,067,006
[45] Date of Patent: Nov. 19, 1991

[54] SEMICONDUCTOR DEVICE

[75] Inventor: Nobuo Shiga, Yokohama, Japan

[73] Assignee: Sumitomo Electric Industries, Ltd., Osaka, Japan

[21] Appl. No.: 567,814

[22] Filed: Aug. 15, 1990

[30] Foreign Application Priority Data

Aug. 28, 1989 [JP] Japan .................................. 1-220847

[51] Int. Cl.$^5$ ............................................ H01L 23/02
[52] U.S. Cl. .......................................... 357/74; 357/80
[58] Field of Search .................... 357/74, 80, 67, 84

[56] References Cited

U.S. PATENT DOCUMENTS

| | | | |
|---|---|---|---|
| 4,266,239 | 5/1981 | Miyagaki et al. | 357/84 |
| 4,617,586 | 10/1986 | Cuvilliers et al. | 357/80 |
| 4,788,584 | 11/1988 | Hirano et al. | 357/51 |
| 4,952,795 | 8/1990 | Gauthier et al. | 307/565 |

Primary Examiner—Andrew J. James
Assistant Examiner—T. Davenport
Attorney, Agent, or Firm—Stevens, Davis, Miller & Mosher

[57] ABSTRACT

The device includes an insulating substrate and first and second conducting patterns, electrically insulated from another, formed on the substrate. The second conducting pattern is connected to ground. A semiconductor chip is die-bonded to the first conducting pattern. The chip has a reception circuit, including a capacitor, formed therein, and a metal film is formed on a back surface of the chip. The capacitor includes a first terminal and a second terminal, with one of the first terminal and the second terminal being electrically connected to the first conducting pattern, such that the electric potential of the capacitor is transmitted to the metal film formed on the back surface of the chip. A buffer amplifier is interposed between the one of the first terminal and the second terminal which is electrically connected to the first conducting pattern such that the potential of the capacitor is transmitted to the metal film through the buffer amplifier. The first and second terminals constitute parallel electrode patterns forming the capacitor.

3 Claims, 3 Drawing Sheets

SEMICONDUCTOR DEVICE

BACKGROUND OF THE INVENTION

1. Field of the Invention

The present invention relates to a semiconductor device used in a light reception circuit section or the like in an optical data link or an optical CATV system.

2. Description of the Related Background

A conventional light reception circuit of this type is shown in FIG. 1, for example. A light signal is received by a light-receiving element 1 and converted into a voltage signal by a resistor $R_L$. A direct-current component is removed by a capacitor $C_C$ from the reception signal which is converted into the voltage signal, and the reception signal is amplified and demodulated by an amplifier 2. The resistor $R_L$, the capacitor $C_C$, and the amplifier 2 are formed on the same integrated circuit (IC) chip 3. Generally, the resistor $R_L$ has a resistance of several hundreds ohms to 10 k$\Omega$, and the direct-current component cutoff capacitor $C_C$ has a capacitance of several pico-farad to several hundreds pico-farad. A junction capacitance $C_{PD}$ of about 0.5 pF is present in a p-n junction of the light-receiving element 1, a floating capacitance $C_{CG}$ (to ground) is present in the capacitor $C_C$, and an input capacitance $C_{IN}$ is present in an input section of the amplifier 2. When an input resistance of the amplifier 2 is given by $R_{IN}$, a high-pass cutoff frequency $F_H$ and a low-pass cutoff frequency $F_L$ of the reception signal are expressed by the following equations, respectively.

$$F_H = 1/[2\pi(R_L//R_{IN})\cdot(C_{PD}+C_{IN}+C_{CG})]. \quad (1)$$

$$F_L = 1/[2\pi(R_L//R_{IN})\cdot C_C] \quad (2)$$

FIGS. 2(A) and 2(B) show the inside of a package when the IC chip is packaged. FIG. 2(A) is a plan view of the IC chip, and the FIG. 2(B) is a side view of the IC chip. A common ground pattern 5 which is set at a common reference voltage for the circuit is formed on a ceramic substrate 4, and IC chip 3 is die-bonded on the ground pattern 5 through a back metal formed on the back of the IC chip 3. A reference potential of an inner circuit of the IC chip 3 is set to be equal to a potential of the ground pattern 5 by means of a wire. A signal terminal pattern 6 electrically isolated from the common ground pattern 5 is wire-bonded with external terminals of the IC chip 3 and electrically connected to frame lead pins.

In the above conventional device arrangement, when the resistance of the resistor $R_L$ is increased to improve receiving sensitivity of the circuit, an S/N ratio showing a signal-to-noise ratio is increased, thereby improving the receiving sensitivity. However, as understood from equation (1), the high-pass cutoff frequency $F_H$ is decreased. When the resistance of the resistor $R_L$ is constant, the high-pass cutoff frequency $F_H$ is increased proportional to a decrease in capacitance of $(C_{PD}+C_{IN}+C_{CG})$.

In order to decrease the low-pass cutoff frequency $F_L$, as understood from equation (2), when the resistance of the resistor $R_L$ is constant, the capacitance of the direct-current component cutoff capacitor $C_C$ must be large. For this reason, an electrode pattern 7 for the capacitor $C_C$ occupies a large area in the IC chip 3 as shown in FIG. 3. Therefore, the floating capacitance $C_{CG}$ present between the electrode pattern 7 and the ground pattern 5 is increased, thereby decreasing the high-pass cutoff frequency $F_H$. In addition, when the capacitance of the capacitor $C_C$ is decreased to decrease the floating capacitance $C_{CG}$, the low-pass cutoff frequency $F_L$ is increased, thereby increasing jitter.

SUMMARY OF THE INVENTION

It is an object of the present invention to provide a semiconductor device having a high receiving sensitivity and a wide receiving band. According to the present invention, a reception circuit for removing a direct-current component of a reception signal by a capacitor is incorporated in a semiconductor chip, a metal film is provided on a back of the semiconductor chip, a first conductive pattern set at a common reference voltage for the circuit is formed on an electrically insulating substrate, a second conductive pattern is formed to be electrically insulated from the first conductive pattern, the metal film of the semiconductor chip is fixed to the second conductive pattern, and the voltage of the second conductive pattern is equal to the voltage of the capacitor of the reception circuit.

Therefore, a variation in voltage of the capacitor formed within the semiconductor chip is substantially equal to a variation in voltage of the second conductive pattern underlying the capacitor. As a result, there is almost no floating capacitance in the capacitor for removing a direct-current component of the reception signal. For this reason, a semiconductor device having a high receiving sensitivity and a wide receiving band can be provided. The device according to the present invention is effectively employed to a high-speed and wide-band communication system.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 4A:
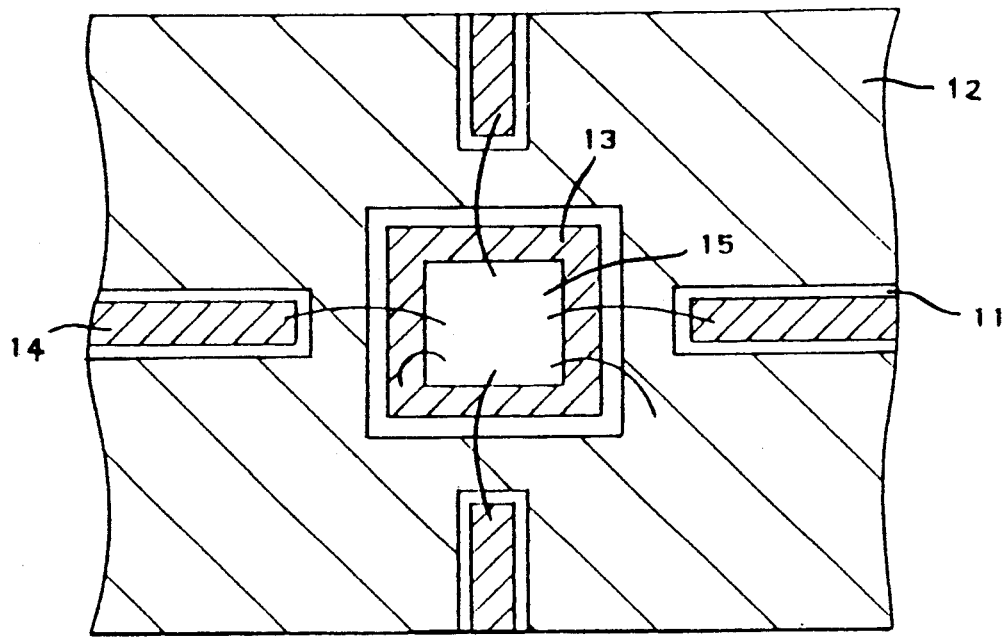
FIG. 4A is a plan view showing the inside of a semiconductor device according to the one embodiment of the present invention.
Figure 4B:
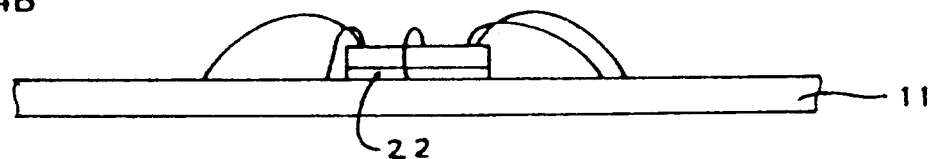
FIG. 4B is a side view showing the inside of the semiconductor device shown in FIG. 4A.

FIGS. 4A and 4B show an embodiment of the present invention, in which FIG. 4A is a plan view and FIG. 4B is a side view.

A ceramic substrate 11 is made of an electrically insulating material such as alumina ($Al_2O_3$). The substrate 11 is metallized by gold-palladium or silver-palladium to form a ground pattern 12 in a wide area. The ground pattern 12 is set at a common reference voltage of each semiconductor circuit chip mounted on the substrate 11. The metal used in metallization is patterned by etching techniques to form an island-like die area pattern 13 electrically isolated from the ground pattern 12. By patterning, a signal terminal pattern 14 having an elongated shape is formed to be electrically isolated from the ground pattern 12.

An IC chip 15 which incorporates a light reception circuit is die-bonded on the die area pattern 13, and a metal film 22 formed on the back side surface of the IC chip 15 is electrically connected and fixed to the die area pattern 13. The external terminals of the IC chip 15 are wire-bonded on the signal terminal pattern 14, thereby transferring a signal from the circuit to a frame lead pin (not shown) connected to the signal terminal pattern 14. One of the external terminals of chip 15 is wire-bonded on the die area pattern 13 (see FIG. 4A).

Figure 5:
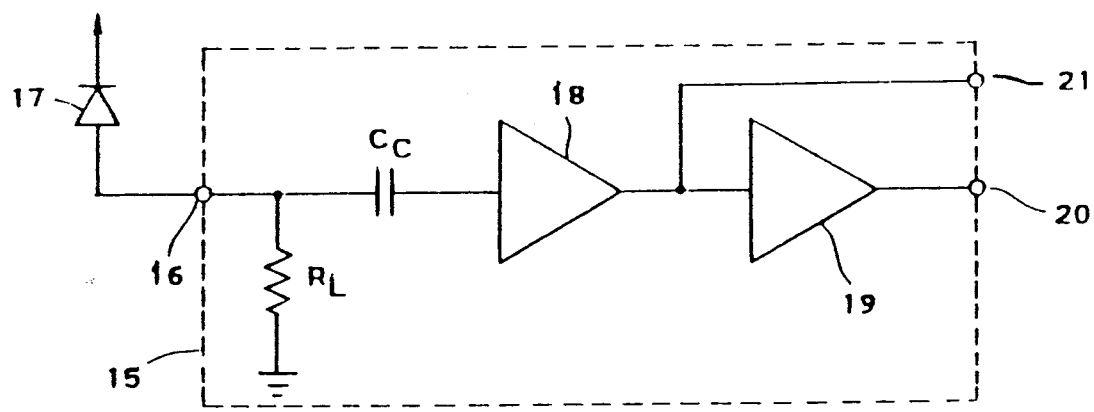
FIG. 5 is a circuit diagram showing a light reception circuit on an IC chip mounted on the semiconductor device shown in FIGS. 4A and 4B.

FIG. 5 shows a circuit incorporated in the IC chip 15. An external terminal 16 of the IC chip 15 is connected to a light-receiving element 17 such as a photodiode outside the chip and connected to a resistor $R_L$ inside the chip. That is, the light-receiving element 17 and the resistor $R_L$ are connected in series with each other and the resistor $R_L$ are electrically connected to the ground pattern 12. The external terminal 16 is connected to one terminal of a capacitor $C_C$ formed inside the chip, and the other terminal of the capacitor $C_C$ is connected to the input terminal of a buffer amplifier 18 which is a non-inverting amplifier having an amplification factor of 1. The buffer amplifier 18 is constituted by a source follower circuit and the like, and an output from the amplifier 18 is sent to an amplifier 19. The output terminal of the amplifier 19 is connected to an external terminal 20, and the external terminal 20 is connected to a receiver (not shown). The output terminal of the buffer amplifier 18 is connected to an external terminal 21, and the external terminal 21 is wire-bonded on the above die area pattern 13 to be electrically connected with the above die area pattern 13.

In the above arrangement, when a light signal is received by the light-receiving element 17, the light signal is converted into an optical output current. The optical output current is converted into a voltage signal by the resistor $R_L$, and then a direct-current component of the voltage signal is removed by the capacitor $C_C$. The reception signal from which the direct-current component is removed is amplified and demodulated by the amplifier 19 through the buffer amplifier 18. The demodulated signal is sent to the receiver through the external terminal 20. The reception signal output from the buffer amplifier 18 is sent to the die area pattern 13 through the external terminal 21. For this reason, the voltage of the capacitor $C_C$ is applied to the die area pattern 13.

Therefore, a variation in voltage of the capacitor $C_C$ is substantially equal to a variation in voltage of the die area pattern 13 underlying the IC chip 15. That is, the amplitudes of the voltages at the capacitor $C_C$ and the metal film formed on the back side of the IC chip 15 are equal to each other, and the phases of their voltages are equal to each other. In this case, a floating capacitance $C_{CG}$ to ground (die area pattern 13) of the capacitor $C_C$ is parasitically formed between the electrode of the capacitor $C_C$ and the metal film (die area pattern 13). That is, since the floating capacitance $C_{CG}$ defines a rate of variation in charge accumulated between both the electrodes to a variation in voltage applied between both the electrodes, the floating capacitance $C_{CG}$ is negligible.

For this reason, the high-pass cutoff frequency $F_H$ of the reception signal expressed in equation (1) can be increased because the floating capacitance $C_{CG}$ can be neglected. The capacitance of the direct-current component cutoff capacitor $C_C$ can be increased regardless of the floating capacitor $C_{CG}$, and the low-pass cutoff frequency $F_L$ expressed in equation (2) can be decreased. Therefore, the width of a receiving band of the circuit is increased. In addition, since the capacitance $C_{CG}$ is decreased in equation (1) and the capacitance $C_C$ is increased in equation (2), the resistance of the resistor $R_L$ can be increased, thereby improving the receiving sensitivity of the circuit.

In the light reception circuit of this type, the low-pass cutoff frequency $F_L$ is generally set to be less than 1/100 to 1/1,000 of the high-pass cutoff frequency $F_H$. Therefore, in order to form a light reception circuit having, e.g., a bandwidth of 500 MHz, the low-pass cutoff frequency $F_L$ must be set to be less than 5 MHz. When a minimum receiving sensitivity is set at $-30$ dBm, the resistor $R_L$ connected to the light-receiving element 17 in series must have a resistance of 1 k$\Omega$ at least. In this case, the capacitance of the direct-current component cutoff capacitor $C_C$ can be calculated by substituting each constant in equation (2) expressing the low-pass cutoff frequency $F_L$ as follows. In this case, since the resistance of the resistor $R_L$ is sufficiently larger than that of the input resistor $R_{IN}$ of the amplifier 19, the resistance of the parallel combination resistor $R_L/R_{IN}$ of the resistor $R_L$ and the resistor $R_{IN}$ is substantially equal to that of the resistor $R_L$.

$$5 \times 10^6 = 1/(2\pi \cdot 1 \times 10^3 \cdot C_C)$$

$$\therefore C_C = 31.8 \, pF$$

A capacitance per unit area of a capacitor which can be monolithically formed on the IC chip falls within the range of about 0.05 to 0.1 fF/$\mu$ m$^2$. In this case, even if a capacitor having a capacitance per unit area of 0.1 fF/$\mu$ m$^2$ can be formed, the area of the capacitor $C_C$ is 318,000 $\mu$m$^2$.

Figure 1:
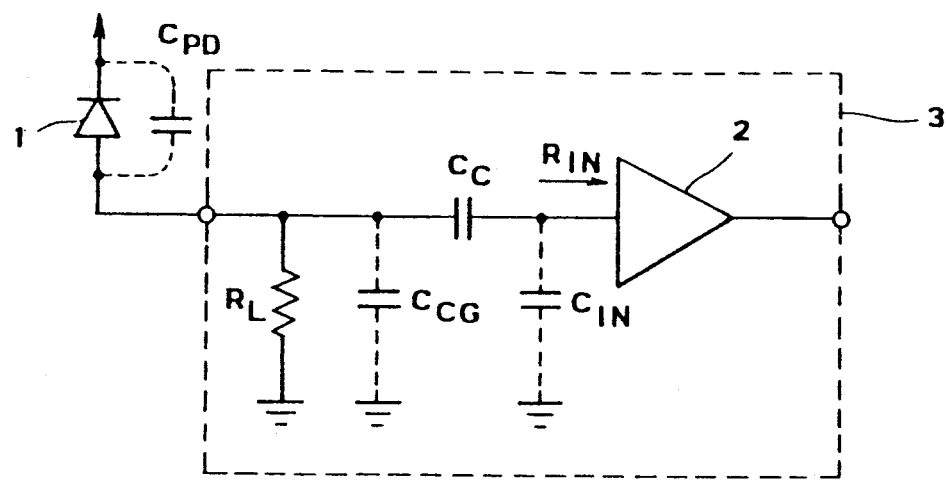
FIG. 1 is a circuit diagram showing a light reception circuit on a conventional IC chip mounted on a semiconductor device.
Figure 2A:
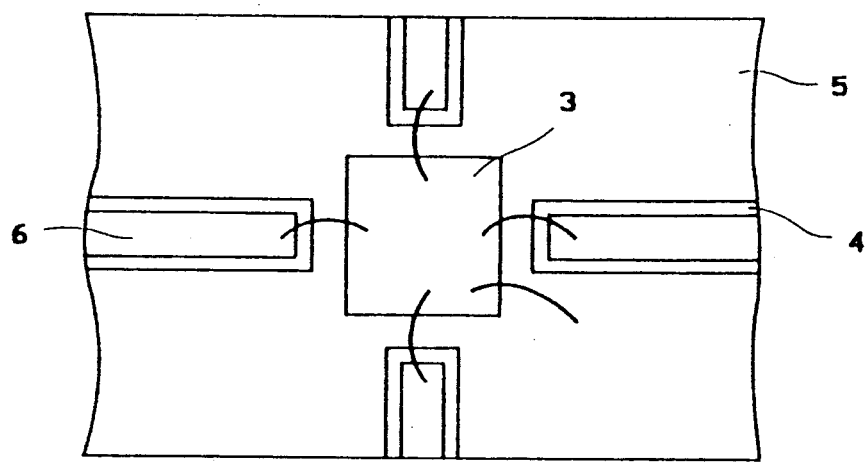
FIG. 2A is a plan view showing the inside of the semiconductor device on which the conventional IC chip shown in FIG. 1 is mounted.
Figure 2B:
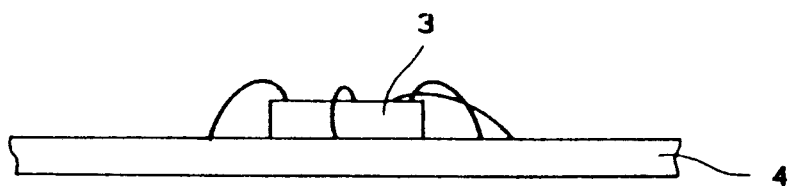
FIG. 2B is a side view showing the inside of the conventional semiconductor.
Figure 3:
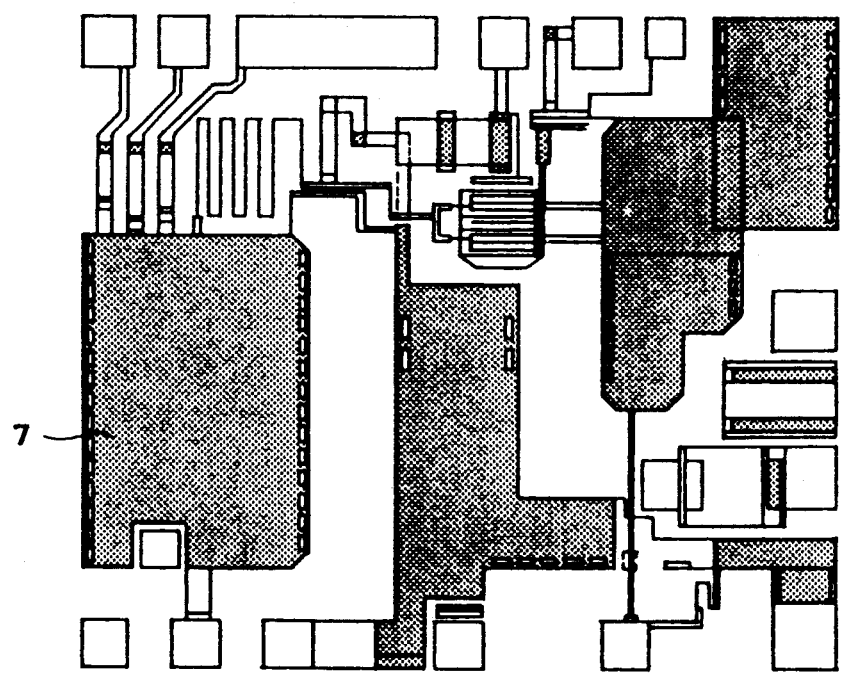
FIG. 3 is a view showing a electrode pattern of the conventional IC chip shown in FIG. 1.

In the conventional arrangement shown in FIGS. 1 and 2, when the capacitor $C_C$ having this area is formed, a floating capacitance $C_{CG}$ (to ground) of the capacitor $C_C$ is as follows. In this case, assume that the IC is made of gallium arsenide (GaAs), that the thickness of a GaAs substrate is normally set to be 400 $\mu$m, and that its specific dielectric constant $\epsilon$ is set to be 13.

$$C_{CG} = \epsilon \cdot \epsilon \cdot (318,000 \div 400) = 92 fF$$

The sum ($C_{PD} + C_{IN}$) of the junction capacitance $C_{PD}$ of the light-receiving element 1 and the input capacitance $C_{IN}$ of the amplifier 2 falls within the range of 0.4 to 0.6 pF. For this reason, in a conventional device arrangement, the ratio of the floating capacitance $C_{CG}$ to the sum of the capacitances is about 20%, and the floating capacitance cannot be neglected. Therefore, the denominator of equation (1) is increased, and the high-pass cutoff frequency $F_H$ is decreased due to the influence of the floating capacitance $C_{CG}$. As a result, the bandwidth of the signal received by the circuit is narrowed.

However, according to the present invention, the variation in voltage of the capacitor $C_C$ is substantially equal to the variation in the die area pattern 13 as described above. Therefore, even when the capacitor $C_C$ has the large area of 318,000 $\mu m^2$, the floating capacitance $C_{CG}$ is negligible in the die area pattern 13. For this reason, the bandwidth of the signal received by the reception circuit is large, and the receiving sensitivity of the circuit is improved.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A semiconductor device comprising:

an insulating substrate;

a first conducting pattern and a second conducting patter formed on said substrate, said first conducting pattern and said second conducting pattern being electrically insulated from each other and said second conducting pattern being connected to ground; and a semiconductor chip having (a) a reception circuit formed therein, said reception circuit including a capacitor, and (b) a metal film formed on a back surface of said chip, said chip being die-bonded on said first conducting pattern, said capacitor being formed in said chip and including a first terminal and a second terminal, one of said first terminal and said second terminal being electrically connected to said first conducting pattern, whereby an electrical potential of said capacitor is transmitted to said metal film.

2. A semiconductor device as in claim 1, wherein a buffer amplifier is interposed between said one of said first terminal and said second terminal, and the potential of said capacitor is transmitted to said metal film through said buffer amplifier.

3. A semiconductor device as in claim 1, wherein said first terminal and said second terminal constitute parallel electrode patterns forming said capacitor.

* * * * *